US012003192B2

(12) United States Patent
Qiao et al.

(10) Patent No.: US 12,003,192 B2
(45) Date of Patent: Jun. 4, 2024

(54) CONVERTER AND METHOD FOR SUPPRESSING LOOP INTERFERENCE OF CONVERTER

(71) Applicant: Delta Electronics (Shanghai) Co., Ltd., Shanghai (CN)

(72) Inventors: Lifeng Qiao, Shanghai (CN); Yong Zeng, Shanghai (CN); Teng Liu, Shanghai (CN); Weibo Qin, Shanghai (CN)

(73) Assignee: DELTA ELECTRONICS (SHANGHAI) CO.,LTD., Shanghai (CN)

( * ) Notice: Subject to any disclaimer, the term of this patent is extended or adjusted under 35 U.S.C. 154(b) by 0 days.

(21) Appl. No.: 17/684,382

(22) Filed: Mar. 1, 2022

(65) Prior Publication Data

US 2022/0311353 A1   Sep. 29, 2022

(30) Foreign Application Priority Data

Mar. 26, 2021   (CN) .......................... 202110328437.8

(51) Int. Cl.
| | |
|---|---|
| *H02M 7/487* | (2007.01) |
| *H02M 1/088* | (2006.01) |
| *H02M 7/537* | (2006.01) |
| *H02M 7/5387* | (2007.01) |
| *H03K 17/28* | (2006.01) |
| *H03K 17/60* | (2006.01) |

(52) U.S. Cl.
CPC ........... *H02M 7/487* (2013.01); *H02M 1/088* (2013.01); *H02M 7/537* (2013.01); *H02M 7/53871* (2013.01); *H03K 17/28* (2013.01); *H03K 17/60* (2013.01)

(58) Field of Classification Search
CPC .. H02M 1/088; H02M 7/53871; H03K 17/28; H03K 17/60; H03K 17/127
See application file for complete search history.

(56) References Cited

U.S. PATENT DOCUMENTS

| | | | | |
|---|---|---|---|---|
| 5,710,698 A | * | 1/1998 | Lai ................... | H03K 17/08148 363/56.05 |
| 6,490,185 B1 | * | 12/2002 | Yamanaka .......... | H02M 7/4833 363/132 |

(Continued)

FOREIGN PATENT DOCUMENTS

| | | |
|---|---|---|
| CA | 2810841 A1 | 9/2013 |
| CN | 1841904 A | 10/2006 |

(Continued)

*Primary Examiner* — Yusef A Ahmed
(74) *Attorney, Agent, or Firm* — CKC & Partners Co., LLC

(57) ABSTRACT

The invention provides a converter and a method for suppressing loop interference of converter. The converter includes first and second switching sets connected to each other. Each switching set includes a plurality of switching devices. The plurality of second switching devices are configured to be turned on for a first time after the turn-off time of the plurality of first switching devices, such that each of the plurality of second switching devices provides a path for current within the first time to reduce a potential difference between the first end of at least one of the plurality of second switching devices and the first end of the remaining of the plurality of second switching devices.

16 Claims, 11 Drawing Sheets

(56) References Cited

U.S. PATENT DOCUMENTS

| | | | | |
|---|---|---|---|---|
| 6,930,899 B2* | 8/2005 | Bakran | ................ | H02M 7/483 363/132 |
| 7,126,409 B2* | 10/2006 | Nielsen | ................ | H02M 7/487 363/132 |
| 8,111,530 B2* | 2/2012 | Ono | ................ | H02M 7/487 363/56.01 |
| 8,582,331 B2* | 11/2013 | Frisch | ................ | H03K 17/6871 363/56.02 |
| 9,531,185 B2* | 12/2016 | Liu | ................ | H02M 1/32 |
| 10,361,626 B2* | 7/2019 | Fu | ................ | H02M 7/483 |
| 10,594,208 B2* | 3/2020 | Zhou | ................ | H02M 1/32 |
| 11,043,943 B2* | 6/2021 | Vemulapati | ................ | H03K 17/567 |
| 11,538,794 B2* | 12/2022 | Matsuoka | ................ | H01L 25/07 |
| 2004/0095790 A1* | 5/2004 | Bakran | ................ | H02M 7/487 363/132 |
| 2004/0124805 A1* | 7/2004 | Edwards | ................ | H02M 7/487 318/700 |
| 2004/0196678 A1* | 10/2004 | Yoshimura | ................ | H03K 17/168 363/79 |
| 2006/0067093 A1* | 3/2006 | Tanaka | ................ | H02M 1/44 363/41 |
| 2007/0159749 A1* | 7/2007 | Oka | ................ | H02M 7/487 361/93.1 |
| 2010/0283514 A1* | 11/2010 | Soeno | ................ | H01L 29/7397 327/109 |
| 2012/0068678 A1* | 3/2012 | Hatae | ................ | H02M 1/34 323/272 |
| 2012/0218785 A1* | 8/2012 | Li | ................ | H02M 7/487 363/21.12 |
| 2013/0039100 A1* | 2/2013 | Kazama | ................ | H02M 7/497 363/41 |
| 2013/0134786 A1* | 5/2013 | Ishigaki | ................ | H02M 3/158 307/71 |
| 2013/0272045 A1* | 10/2013 | Soeiro | ................ | H02M 7/487 363/131 |
| 2014/0003103 A1* | 1/2014 | Aaltio | ................ | H02H 7/1227 363/56.03 |
| 2014/0152276 A1* | 6/2014 | Kobayashi | ................ | H02M 3/158 323/271 |
| 2014/0210447 A1* | 7/2014 | Rutkowski | ................ | H02M 3/158 323/311 |
| 2014/0226384 A1* | 8/2014 | Yoshikawa | ................ | H02M 7/487 363/131 |
| 2015/0138858 A1* | 5/2015 | Kusama | ................ | H02M 7/537 327/109 |
| 2015/0194904 A1* | 7/2015 | Harbourt | ................ | H02M 7/483 363/126 |
| 2015/0207429 A1* | 7/2015 | Akiyama | ................ | H01L 24/49 363/131 |
| 2015/0214856 A1* | 7/2015 | Nakashima | ................ | H02M 7/537 363/131 |
| 2015/0333522 A1* | 11/2015 | Wang | ................ | H02M 7/483 307/43 |
| 2016/0043659 A1* | 2/2016 | Xu | ................ | H02M 1/088 363/131 |
| 2016/0072499 A1* | 3/2016 | Ichikawa | ................ | H02M 1/088 327/432 |
| 2016/0118910 A1* | 4/2016 | Torrico-Bascopé | .. | H02M 7/537 363/131 |
| 2016/0126862 A1* | 5/2016 | Vahedi | ................ | H02M 7/537 363/131 |
| 2016/0204771 A1* | 7/2016 | Stenger | ................ | G11B 5/022 327/108 |
| 2016/0247793 A1* | 8/2016 | Ohno | ................ | H01L 25/072 |
| 2016/0254206 A1* | 9/2016 | Ohno | ................ | H02M 7/003 363/132 |
| 2017/0302152 A1* | 10/2017 | Watanabe | ................ | H03K 17/0406 |
| 2017/0310318 A1* | 10/2017 | Kamiya | ................ | H03K 17/08142 |
| 2017/0317607 A1* | 11/2017 | Agirman | ................ | H02M 7/487 |
| 2018/0041107 A1* | 2/2018 | Yamahira | ................ | H02M 1/08 |
| 2018/0097453 A1* | 4/2018 | Xu | ................ | H02P 27/06 |
| 2018/0130748 A1* | 5/2018 | Ueta | ................ | H01L 23/4334 |
| 2018/0152097 A1* | 5/2018 | Ying | ................ | H02M 7/487 |
| 2018/0269774 A1* | 9/2018 | Goto | ................ | H02M 3/158 |
| 2018/0269799 A1* | 9/2018 | Kimura | ................ | H02M 7/5387 |
| 2019/0123732 A1* | 4/2019 | Asako | ................ | H03K 17/0828 |
| 2019/0157987 A1* | 5/2019 | Zmood | ................ | H02M 1/0048 |
| 2019/0267895 A1* | 8/2019 | Masuda | ................ | H02M 3/155 |
| 2019/0273445 A1* | 9/2019 | Cho | ................ | H03K 17/0822 |
| 2019/0288678 A1* | 9/2019 | Mochiki | ................ | H02M 1/08 |
| 2019/0310675 A1* | 10/2019 | Araragi | ................ | G05F 1/461 |
| 2020/0007122 A1* | 1/2020 | Araragi | ................ | H02M 7/5387 |
| 2020/0112303 A1* | 4/2020 | Suzuki | ................ | H03K 17/127 |
| 2020/0112308 A1* | 4/2020 | Suzuki | ................ | H03K 17/74 |
| 2020/0136603 A1* | 4/2020 | Dewa | ................ | H03K 17/168 |
| 2020/0177100 A1* | 6/2020 | Wang | ................ | H02M 7/5387 |
| 2020/0185359 A1* | 6/2020 | Nakashima | ................ | H02M 1/088 |
| 2020/0321319 A1* | 10/2020 | Matsuoka | ................ | H01L 29/7393 |
| 2020/0389099 A1* | 12/2020 | Sagasta | ................ | H02M 7/53871 |
| 2021/0159795 A1* | 5/2021 | Lin | ................ | H02M 3/158 |
| 2022/0209661 A1* | 6/2022 | Jin | ................ | H02M 3/1584 |
| 2022/0209684 A1* | 6/2022 | Jin | ................ | H02M 3/1584 |
| 2022/0311330 A1* | 9/2022 | Lu | ................ | H02M 7/487 |
| 2022/0330415 A1* | 10/2022 | Qiao | ................ | H05K 1/0204 |
| 2022/0377898 A1* | 11/2022 | Fortin-Blanchette | ................ | H05K 1/0204 |
| 2023/0108766 A1* | 4/2023 | Denison | ................ | H02M 7/53873 600/14 |

FOREIGN PATENT DOCUMENTS

| | | |
|---|---|---|
| CN | 101694972 A | 4/2010 |
| CN | 101803021 A | 8/2010 |
| CN | 102868291 A | 1/2013 |
| CN | 105846403 A | 8/2016 |
| CN | 208924134 U | 5/2019 |
| CN | 209964030 U | 1/2020 |
| CN | 210780525 U | 6/2020 |
| CN | 111478609 A | 7/2020 |

* cited by examiner

800 providing a converter, comprising a first switching group and a second switching group connected to each other; the first switching group comprising a plurality of first switching devices, first ends of the plurality of first switching devices are connected to each other, and second ends of the plurality of first switching devices are connected to each other; the second switching group comprising a plurality of second switching devices, first ends of the plurality of second switching devices are connected to each other, and second ends of the plurality of second switching devices are connected to each other ╱S801 configuring the plurality of second switching devices to turn on within a first time after the plurality of first switching devices are turned off, such that each of the plurality of second switching devices provides a path for current within the first time to reduce a potential difference between the first end of the at least one of the plurality of second switching devices and the first end of the remaining of the plurality of second switching devices ╱S802

FIG.8

CONVERTER AND METHOD FOR SUPPRESSING LOOP INTERFERENCE OF CONVERTER

CROSS-REFERENCE TO RELATED APPLICATIONS

This non-provisional application claims priority under 35 U.S.C. § 119(a) on Patent Applications No. 202110328437.8 filed on Mar. 26, 2021, in P.R. China, the entire contents of which are hereby incorporated by reference.

Some references, if any, which may include patents, patent applications and various publications, may be cited and discussed in the description of this application. The citation and/or discussion of such references, if any, is provided merely to clarify the description of the present application and is not an admission that any such reference is "prior art" to the application described herein. All references listed, cited and/or discussed in this specification are incorporated herein by reference in their entireties and to the same extent as if each reference was individually incorporated by reference.

FIELD

The invention relates to the field of power electronic converter, and particularly to a converter and a method for suppressing loop interference of the converter.

BACKGROUND

With gradual progress of power electronic device technology and information and control technology, the demand for high-power converters in the market is dramatically increasing. Due to the current capacity limitation of full-controlled high-power electronic devices, it is quite difficult to directly realize the demand for a high capacity of the converter, and cost is high. Therefore, it can be implemented by the power electronic devices connected in parallel.

In large capacity converter, parallel connection of the power electronic devices has become popular. For example, the power electronic devices can be electrically connected by a parallel bus. Assuming that connection nodes between the power electronic devices and the parallel bus are marked to a, b, c, there is such a situation where the current flows through anti-parallel diodes of the power electronic devices connected in parallel, and cut-off times of the currents on the diodes are inconsistent. Accordingly, if node a represents the connection node between the parallel bus and the power electronic device where current is firstly cut off, and node b represents the connection node between the parallel bus and the power electronic device where current is not cut off, since the parallel bus between the parallel power electronic devices have parasitic inductance, a certain voltage difference exists between the nodes a and b.

Due to existence of the voltage difference between the nodes a and b, other devices connected thereto are interfered. For example, such interference can be interference to a voltage sampling circuit of other device, influence on an insulation level of other device, interference of a driving signal to other parallel devices using a central drive (i.e., the parallel devices are only configured with one group of drive modules) manner, and the problem of Electro-Magnetic Interference (EMI) of the system.

Therefore, suppression of the voltage difference between the nodes a and b caused by inconsistency of the turn-off times of the currents of the anti-parallel diodes of the power electronic devices is the key for solving interference.

SUMMARY

An object of the invention is to provide a converter and a method for suppressing loop interference of the converter, which can solve one or more deficiencies of the prior art.

To achieve the above object, according to one embodiment of the invention, the invention provides a converter, comprising a first switching set, comprising a plurality of first switching devices, wherein first ends of the plurality of first switching devices are electrically connected to each other, and second ends of the plurality of first switching devices are electrically connected to each other; and a second switching set electrically connected to the first switching set, wherein the second switching set comprises a plurality of second switching devices, and first ends of the plurality of second switching devices are electrically connected to each other, and second ends of the plurality of second switching devices are electrically connected to each other; wherein the plurality of second switching devices are turned on for a first time after the turn-off time of the plurality of first switching devices, such that each of the plurality of second switching devices provides a current loop within the first time to reduce an electrical potential difference between the first end of at least one of the plurality of second switching devices and the first end of the remaining of the plurality of second switching devices.

To achieve the above object, the invention further provides a method for suppressing loop interference of a converter, comprising: providing a converter, wherein the converter comprises a first switching set and a second switching set electrically connected to each other, and the first switching set comprises a plurality of first switching devices, and first ends of the plurality of first switching devices are electrically connected to each other, and second ends of the plurality of first switching devices are electrically connected to each other, and the second switching set comprises a plurality of second switching devices, and first ends of the plurality of second switching devices are electrically connected to each other, and second ends of the plurality of second switching devices are electrically connected to each other; configuring the plurality of second switching devices to turn on for a first time after the turn-off time of the plurality of first switching devices, such that each of the plurality of second switching devices provides a current loop within the first time to reduce an electrical potential difference between the first end of the at least one of the plurality of second switching devices and the first end of the remaining of the plurality of second switching devices.

The additional aspects and advantages of the invention are partially explained in the below description, and partially becoming apparent from the description, or can be obtained through the practice of the invention.

BRIEF DESCRIPTION OF THE DRAWINGS

The exemplary embodiments are described in details with reference to the accompanying drawings, through which the above and other features and advantages of the invention will become more apparent.

FIG. 8 is a flowchart of a method for suppressing loop interference of a converter according to an exemplary embodiment of the invention.

DETAILED DESCRIPTION

Figure 1A:
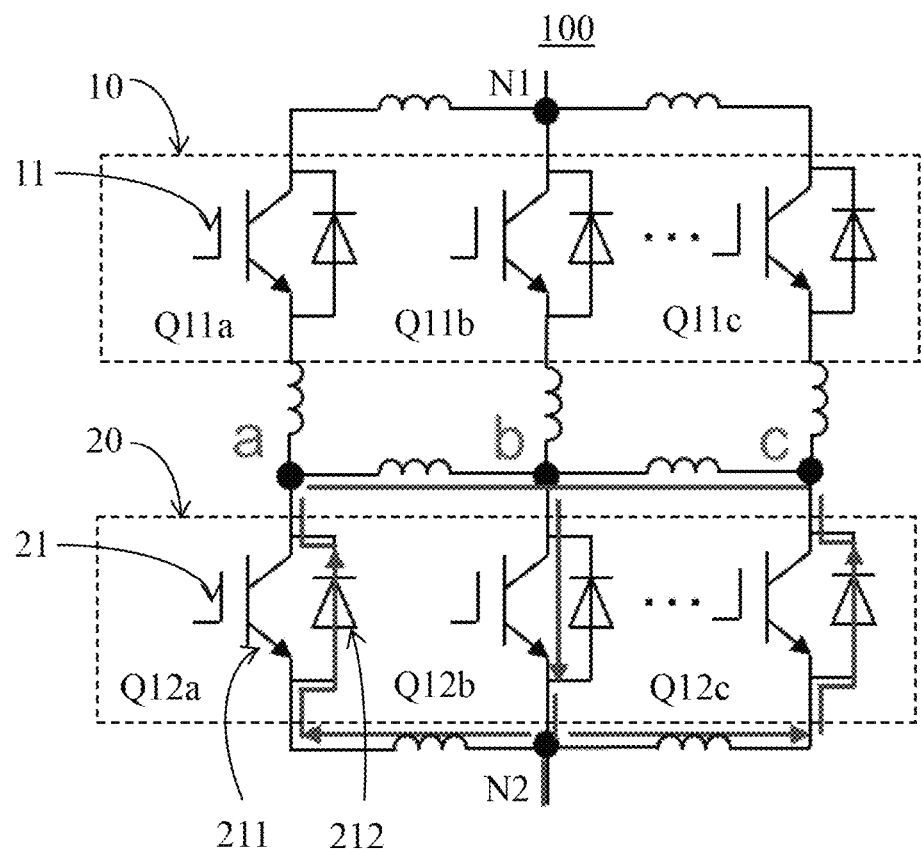
FIG. 1A is a schematic diagram of a circuit of a converter according to one embodiment of the invention.

The exemplary embodiments will now be described more fully with reference to the accompanying drawings. However, the exemplary embodiments can be implemented in various forms and shall not be understood as being limited to the embodiments set forth herein; on the contrary, these embodiments are provided so that this invention will be thorough and complete, and the conception of exemplary embodiments will be fully conveyed to those skilled in the art. In the drawings, the same reference sign denotes the same or similar structure, so their detailed description will be omitted.

When factors/components/the like described and/or illustrated here are introduced, the phrases "one", "a(an)", "the", "said" and "at least one" refer to one or more factors/components/the like. The terms "include", "comprise" and "have" refer to an open and included meaning, and refer to additional factors/components/the like, in addition to the listed factors/components/the like. The embodiments may use relative phrases, such as, "upper" or "lower" to describe a relative relation of one signed component over another component. It shall be understood that if the signed device reverses to turn upside down, the described component on an "upper" side will become a component on a "lower" side. In addition, the terms "first", "second" and the like in the claims are only used as signs, instead of numeral limitations to objects.

Figure 1B:
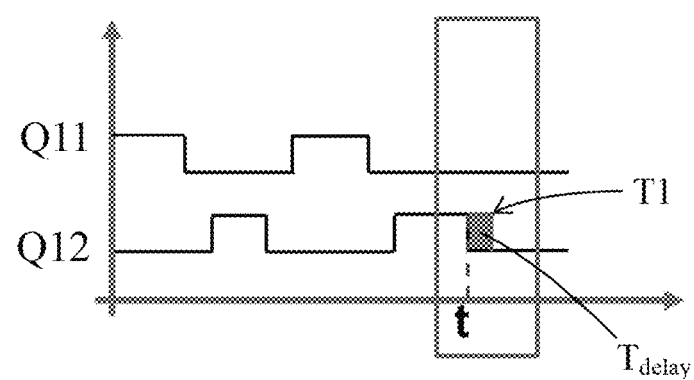
FIG. 1B is a schematic graph of a driving signal of a switching device of the circuit shown in FIG. 1A.

As shown in FIGS. 1A and 1B, in this embodiment, the present disclosure provides a converter 100, and the converter 100 includes a first switching set 10 and a second switching set 20 electrically connected to each other. The first switching set 10 comprises a plurality of first switching devices 11, and first ends of the plurality of first switching devices 11 are electrically connected to each other, and second ends of the plurality of first switching devices 11 are electrically connected to each other. The second switching set 20 comprises a plurality of second switching devices 21, and first ends of the plurality of second switching devices 21 are electrically connected to each other, and second ends of the plurality of second switching devices 21 are electrically connected to each other. For example, in the embodiment shown in FIG. 1A, the plurality of first switching devices 11 of the first switching set 10 may include switching devices Q11a, Q11b, . . . , and Q11c connected in parallel, and the first ends of the plurality of first switching devices 11, for example, may be electrically connected to each other at a node N1, and the second ends of the plurality of first switching devices 11, for example, may be electrically connected to nodes a, b, . . . , and c connected to each other. The plurality of first switching devices 21 of the second switching set 20 may include switching devices Q12a, Q12b, . . . , and Q12c connected in parallel, and the first ends of the plurality of first switching devices 21, for example, may be electrically connected to nodes a, b, . . . , and c connected to each other, and the second ends of the plurality of first switching devices 21, for example, may be electrically connected to each other at a node N2.

As shown in FIG. 1B, the waveform corresponding to Q11 represents waveforms of the each of the switching devices Q11a, Q11b, . . . , and Q11c in the first switching set 10, and the waveform corresponding to Q12 represents waveforms of each of the switching devices Q12a, Q12b, . . . , and Q12c in the second switching set 20. Referring to FIG. 1A, in the embodiment, the plurality of second switching devices 21 are configured to be turned on within a first time T1 after the plurality of first switching devices 11 are turned off, such that each of the plurality of second switching devices 21 provides a path for current such as freewheeling current, flowing through the second switching devices 21 in the first time T1, in order to reduce an electrical potential difference between the first end of the at least one of the plurality of second switching devices 21 and the first end of the remaining of the plurality of second switching devices 21, thereby avoiding occurrence of interference. In addition, the electrical potential difference, for example, can be zero, i.e., potentials of the nodes a, b, . . . , and c may keep consistent.

In some embodiments, a direction of the current flowing through the at least one of the plurality of second switching devices 21 is opposite to a direction of the current flowing through the remaining of the plurality of second switching devices 21. For example, in the embodiment of FIG. 1A, a direction (shown as the downward arrow) of the current flowing through the switching device Q12b is opposite to a direction (shown as the upward arrow) of the current flowing through the remaining switching devices Q12a, . . . , and Q12c.

In some embodiments, a current value of the current flowing through the at least one of the plurality of second switching devices 21 may be different from a current value of the current flowing through the remaining of the plurality of second switching devices 21. It can be understood that in other embodiments, a current value of the current flowing through the at least one of the plurality of second switching devices 21 also can be the same as a current value of the current flowing through the remaining of the plurality of second switching devices 21, but the present disclosure is not limited thereto.

In some embodiments, the second switching devices 21 may include a first switch 211 and a second switch 212 connected in parallel. For example, the first switch 211 may be an electronic switch, and the second switch 212 may be a semiconductor switch. Optionally, the first switch 211 may be a semiconductor switch, and the second switch 212 may be an electronic switch. Optionally, the first switch 211 may be a semiconductor switch, and the second switch 212 may be a diode. Optionally, the first switch 211 may be a diode, and the second switch 212 may be a semiconductor switch, in which a first end of the semiconductor switch may be electrically connected to a cathode of the diode, and a second end of the semiconductor switch may be electrically connected to an anode of the diode. For example, in the embodiment of FIG. 1A, the second switching devices 21, for example, may be an IGBT module, and may include an IGBT and a body diode anti-parallel to the IGBT. In the embodiment of FIG. 1A, the first switching devices 11 also may be an IGBT module.

Referring to FIGS. 1A and 1B, when the first switching set 10 is turned off, the second switching set 20 may be turned off after a preset time $T_{delay}$. When the switching devices Q12a, Q12b, . . . , and Q12c are turned off at time t, currents flowing through anti-parallel diodes of the switching devices Q12a, Q12b, . . . , and Q12c are non-uniform, such that zero crossing points of the currents on the anti-parallel diodes of Q12a, Q12b, . . . , and Q12c are inconsistent, causing an electrical potential difference between potential of a node corresponding to the anti-parallel diode with the current firstly crossing the zero point and a potential of a node corresponding to other anti-parallel diodes, and generating interference, for example, interference to a voltage sampling circuit of other device, influence on an insulation level of other device, interference of a driving signal to other parallel devices using a central drive manner, and the problem of EMI of the system. In order to solve the above problems, a turn-off time of the second switching set 20 is delayed by a preset time $T_{delay}$, i.e., after the time t, continuing to keep the switching devices Q12a, Q12b, . . . , and Q12c being turned on within the preset time $T_{delay}$, such that each of the switching devices Q12a, Q12b, . . . , and Q12c can provide a bidirectional path for current flow, thereby suppressing a potential difference generated between the nodes a, b, . . . , and c, and reducing the interference. Accordingly, it is also possible to suppress interference to voltage sampling of other device, avoid influence on an insulation level of other device, suppress interference of a driving signal to other parallel devices using a central drive (i.e., the parallel devices are only configured with one group of drive modules) manner, and solve the problem of EMI of the system.

Figure 2:
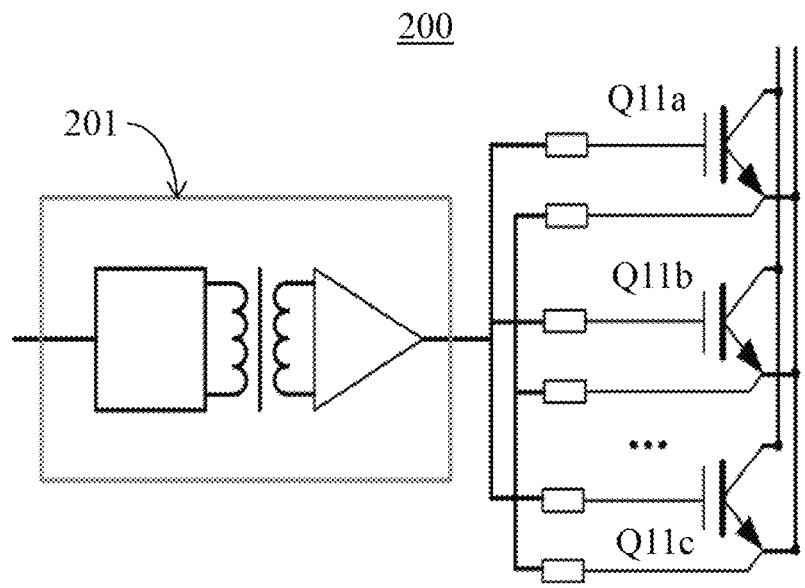
FIG. 2 is a schematic diagram of a circuit of a converter using a central drive manner according to an application embodiment of the invention.

As shown in FIG. 2, it shows a circuit structure 200 of the converter using a central drive manner in an application embodiment of the invention, wherein structure of the converter, for example, is the structure shown in FIG. 1A, and other parallel devices, for example, the switching devices Q11a, Q11b, . . . , and Q11c, are only configured with one set of drive modules 201. In other words, the converter of the present disclosure also may include a central drive module 201 coupled to the plurality of first switching devices (Q11a, Q11b, . . . , and Q11c), respectively, for driving the plurality of first switching devices to turn on or turn off simultaneously, i.e., using a central drive manner.

As for the parallel device, the function of suppressing interference of the driving signal using the central drive manner is explicitly explained.

Embodiment One

Figure 3A:
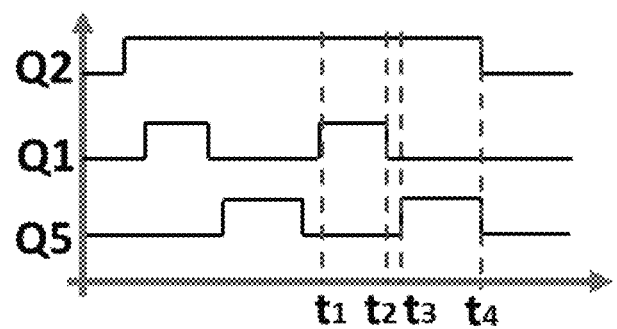
FIG. 3A is a schematic graph of switching logic of a parallel three-level active neutral point clamped (ANPC) circuit under double pulse experimental conditions.
Figure 3B:
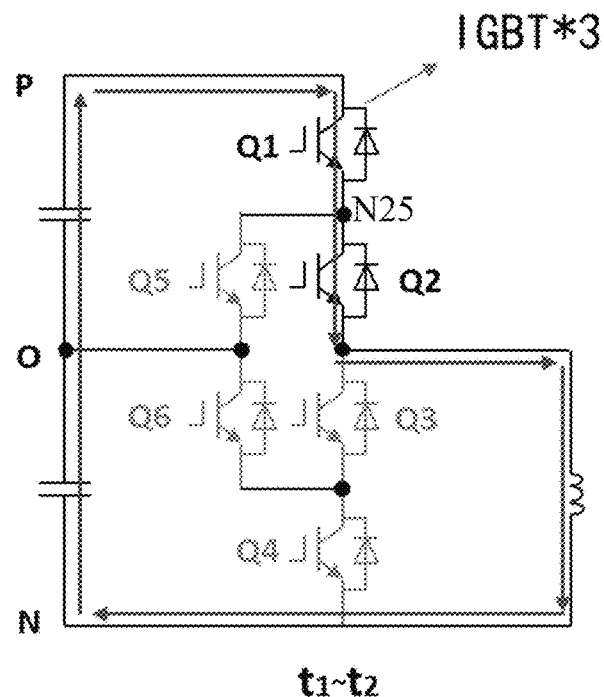
FIG. 3B is a schematic diagram of a working state of the parallel three-level active neutral point clamped (ANPC) circuit at times $t_1$-$t_2$ in FIG. 3A.
Figure 3C:
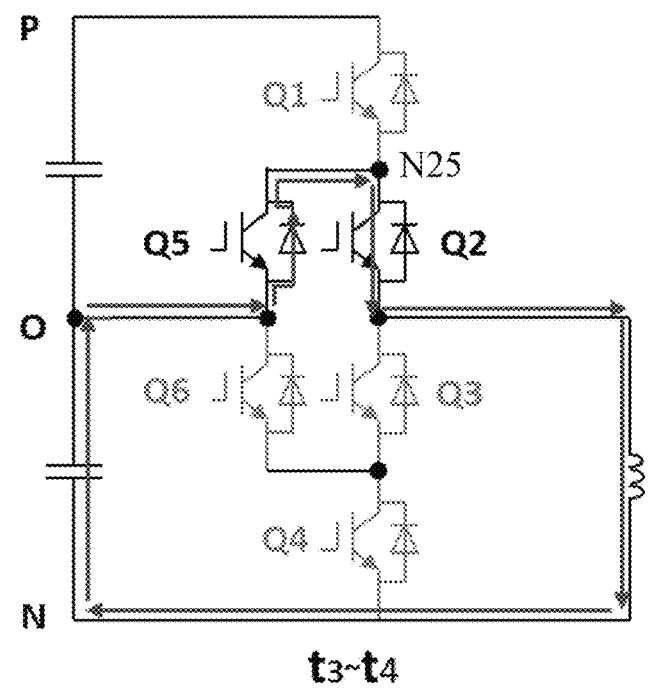
FIG. 3C is a schematic diagram of a working state of the parallel three-level active neutral point clamped (ANPC) circuit at times $t_3$-$t_4$ in FIG. 3A.
Figure 3D:
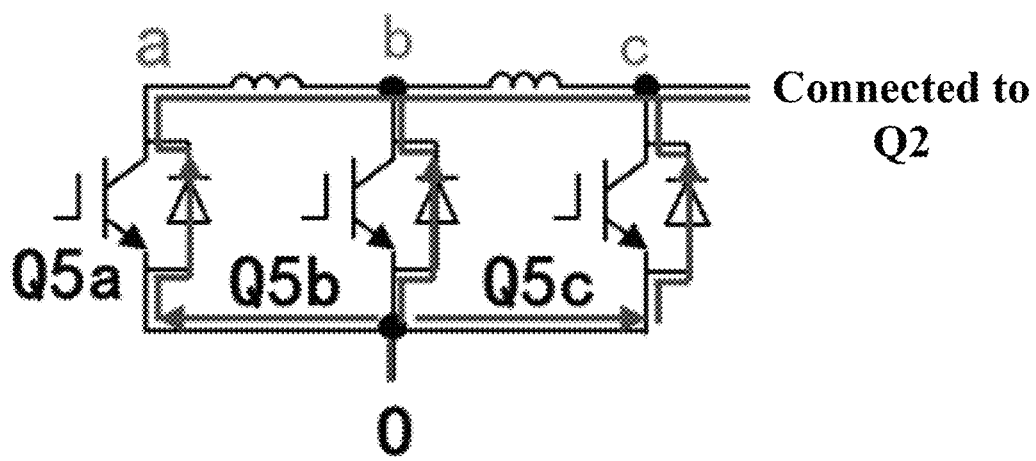
FIG. 3D is a schematic diagram of a working state when switching devices Q5a, Q5b and Q5c with freewheeling through anti-parallel diodes at the time $t_4$ in FIG. 3A.

As shown in FIGS. 3A-3C, as for a three-level active neutral point clamped (ANPC) circuit topology, under dual pulse experimental conditions, switching logic and working state of the circuit are shown in FIGS. 3A, 3B and 3C. To simplify the circuit, in the circuit of this embodiment, the circuit in FIGS. 3B and 3C only shows a one-phase circuit. Specifically, the ANPC may include a first switching set Q1, a second switching set Q5, a third switching set Q2, a fourth switching set Q3, a fifth switching set Q4 and a sixth switching set Q6, and each of the first to sixth switching sets may include n switching devices (e.g., IGBT modules), where n may be greater than or equal to 2. Moreover, the first switching set Q1, the third switching set Q2, the fourth switching set Q3 and the fifth switching set Q4 are sequentially connected in series, and a first end of the second switching set Q5 is electrically connected to a junction node of the first switching set Q1 and the third switching set Q2, and a second end of the second switching set Q5 is electrically connected to a first end of the sixth switching set Q6, and a second end of the sixth switching set Q6 is electrically connected to a junction node of the fourth switching set Q3 and the fifth switching set Q4. Alternatively, the number of the corresponding switching devices of the respective switching set in the figures can be two or more, such as, three, four or five. For example, the switching sets Q1 and Q5 in FIGS. 3B and 3C may correspond to the first switching set 10 and the second switching set 20 in FIG. 1A, respectively, and nodes N25 is between the switching sets Q1 and Q5 at which the switching sets Q1 and Q5 are electrically connected to each other. The switching sets in FIGS. 3B and 3C are formed by a plurality of switching devices connected in parallel. In the description below, the IGBT modules corresponding to the switching set Q5, for example, are switching devices Q5a, Q5b and Q5c shown in FIG. 3D. First ends of these switching devices Q5a, Q5b and Q5c are electrically connected to the nodes a, b and c, respectively, and these nodes a, b and c are electrically connected to each other, and correspondingly connected to the IGBT modules in the switching set Q1, and the switching set Q1 is formed by a plurality of switching devices Q1a, Q1b and Q1c (not shown) connected in parallel.

Referring to FIG. 3A and FIG. 3B, during $t_1$-$t_2$, the working state of the circuit is that the switching sets Q1 and Q2 are turned on, and the switching set Q5 is turned off. As shown in FIG. 3C, during $t_3$-$t_4$, the working state of the circuit is that the switching sets Q2 and Q5 are turned on, and the switching set Q1 is turned off.

Figure 3E:
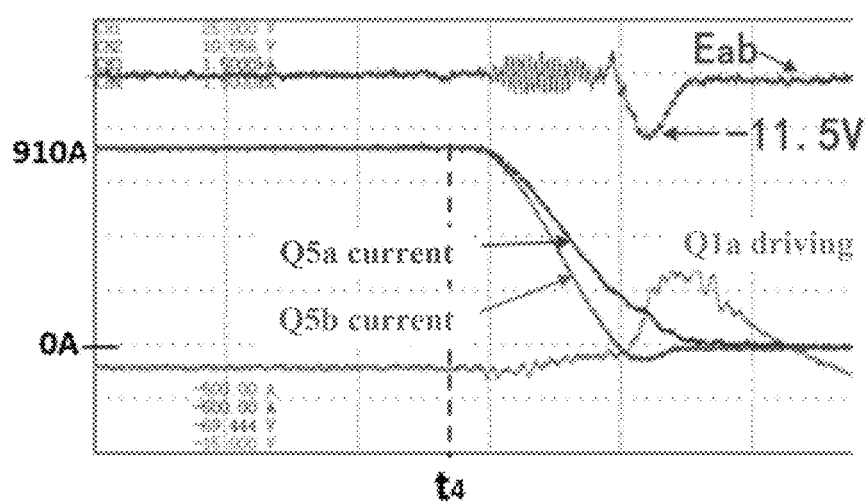
FIG. 3E is a waveform graph of experimental at the time $t_4$ in FIG. 3A.
Figure 3F:
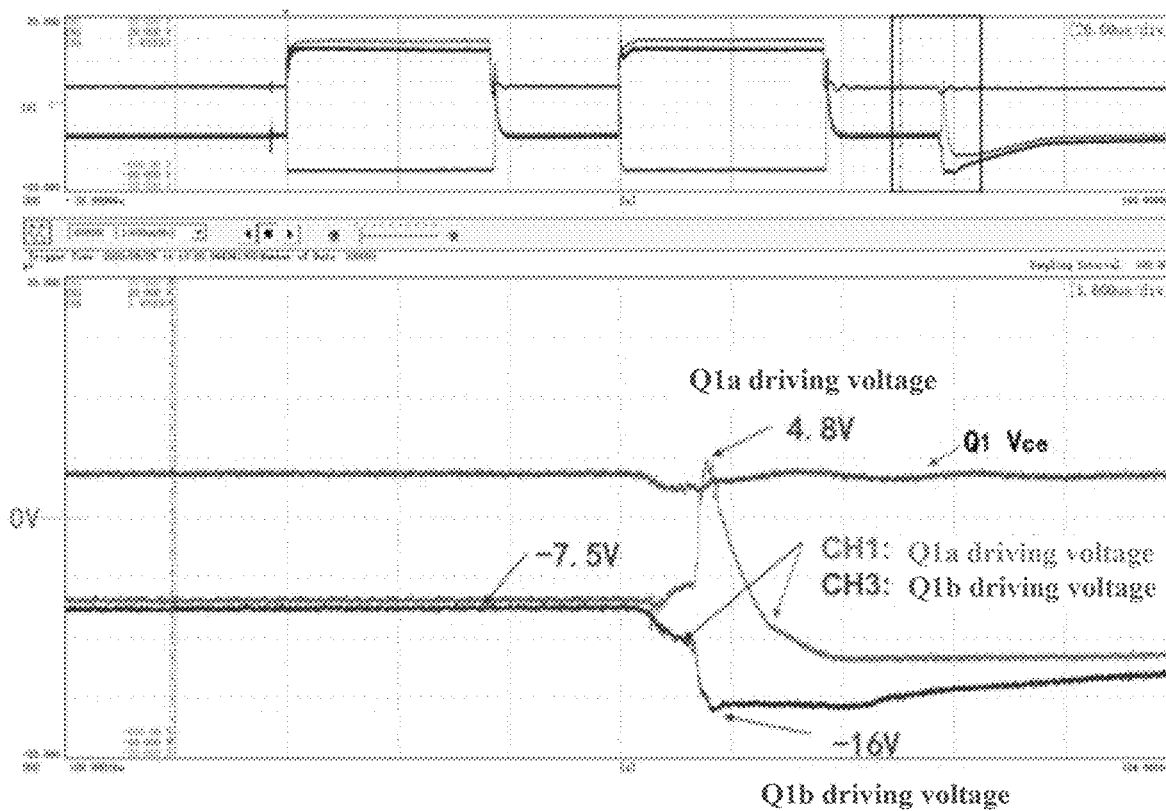
FIG. 3F is a waveform graph of interference to driving voltages of switching devices Q1a and Q1b as an electric potential difference between nodes a and b in FIG. 3D is increased.

At the time $t_4$, the switching sets Q2 and Q5 are turned off, anti-parallel diodes of the switching devices Q5a, Q5b and Q5c corresponding to the switching set Q5 are freewheeled, and zero crossing points of currents on the anti-parallel diodes of the switching devices Q5a, Q5b and Q5c are inconsistent, causing a potential difference between a potential of a node corresponding to the anti-parallel diode with the current firstly crossing zero point and a potential of a node corresponding to other anti-parallel diodes, and producing interference to driving signals of the corresponding switching devices Q1a, Q1b and Q1c of the switching set Q1. FIG. 3E shows the experimental waveforms at the time $t_4$ (for example, a bus voltage is 1480V, and the bus voltage is a voltage between node P and node N in FIGS. 3B and 3C, and a single-tube current of the switching devices Q5a, Q5b and Q5c is 910 A), and it is found from the experimental waveforms that the currents flowing through the anti-parallel diodes of the switching devices Q5a and Q5b are non-uniform. After the current flowing through the anti-parallel diode of the switching device Q5b crosses the zero point, an electric potential difference Eab between the nodes a and b is increased, such that a loop is formed between the nodes a, b and driving of the switching devices Q1a and Q1b, and a loop current is formed, causing interference to driving voltages of the switching devices Q1a and Q1b, and result in false turn-on of the switching group Q1 or damage of the switching devices Q1a and Q1b. As shown in FIG. 3F, it shows waveforms when driving voltages of the switching devices Q1a and Q1b are interfered, specifically, for example, after the driving voltages of the switching devices Q1a and Q1b (e.g., gate voltages of the switching devices) are interfered, the driving voltages jump, such that the driving voltage of the switching device Q1a exceeds a threshold voltage, causing false turn-on of the switching device Q1a, and the driving voltage of the switching device Q1b exceeds a negative threshold, causing damage of the switching device Q1b.

Figure 4A:
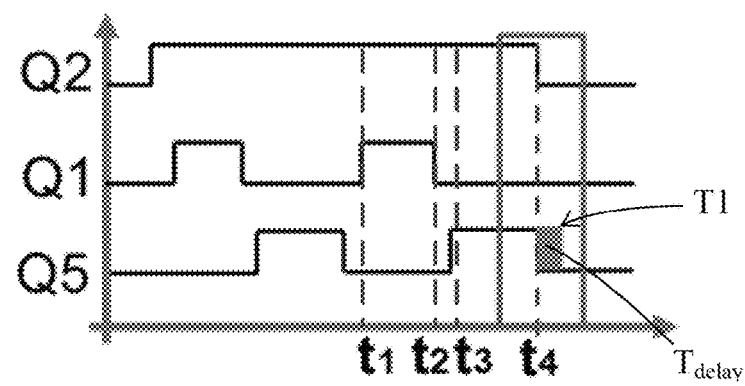
FIG. 4A is a schematic graph of switching logic of the parallel three-level active neutral point clamped (ANPC) circuit according to an exemplary embodiment of the invention, wherein switching group Q5 is turned off after a first time delay after the time $t_4$.
Figure 4B:
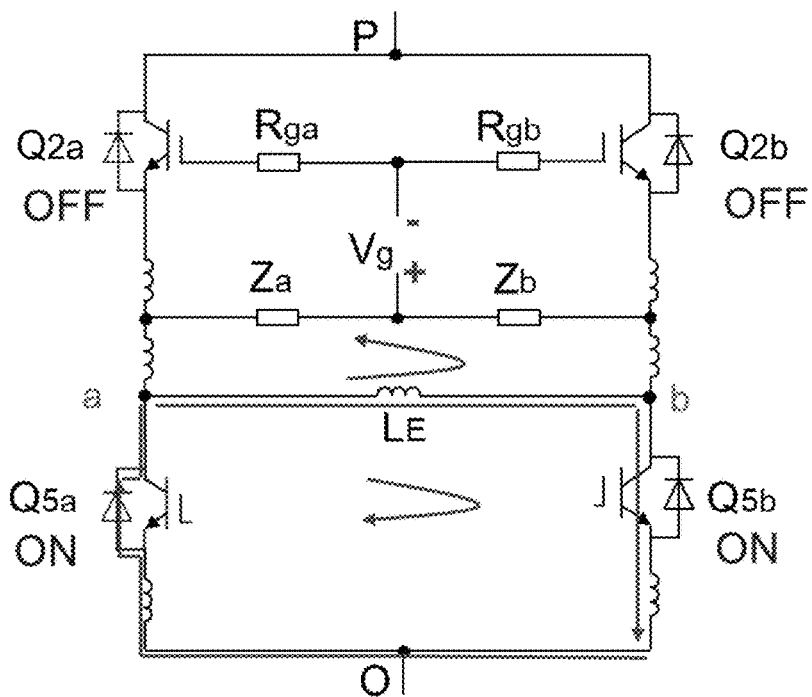
FIG. 4B is a schematic diagram of a circuit according to an exemplary embodiment of the invention, wherein voltages between the nodes a and b of the parallel three-level active neutral point clamped (ANPC) circuit keep substantially consistent, and thus drive loop and interference to the driving of the switching devices Q1a and Q1b are suppressed.

However, as shown in FIG. 4A, at the time $t_4$, the switching set Q2 is turned off, such that a current is decreased, by delaying a preset time $T_{delay}$ and then turning off the switching set Q5, a bidirectional path can be provided for the current flowing through the switching set Q5. As shown in FIG. 4B, after the switching devices Q2a and Q2b are turned off, by keeping the switching devices Q5a and Q5b being turned on for a preset time $T_{delay}$, for example, delaying a preset time $T_{delay}$ after the time $t_4$ and then turning off the switching devices Q5a and Q5b, voltages between the nodes a and b may keep substantially consistent, thereby suppressing generation of an interference signal.

Figure 4C:
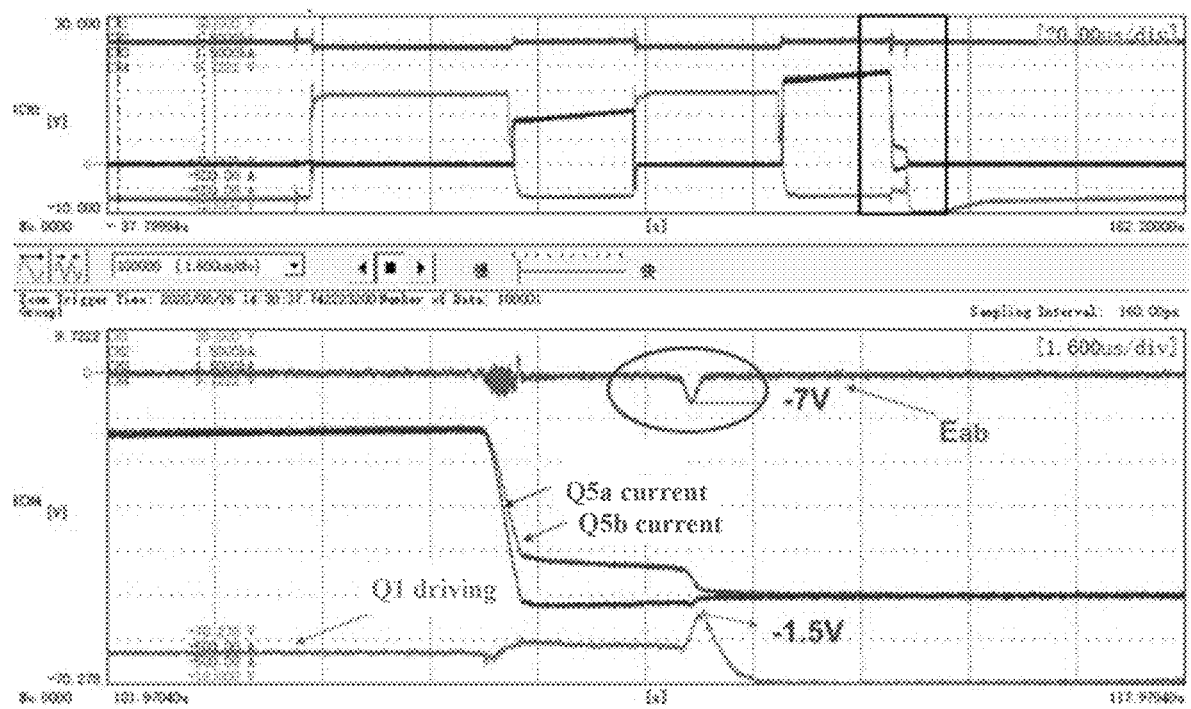
FIG. 4C is an experimental waveform graph of the parallel three-level active neutral point clamped (ANPC) circuit topology according to an exemplary embodiment of the invention under dual pulse experimental conditions, wherein the switching group Q5 is turned off after 3 μs delay after the time $t_4$.

As shown in FIG. 4C, it shows experimental waveforms under dual pulse experimental conditions (for example, a bus voltage is 1480V, and a sing-tube current of the switching devices Q5a and Q5b is 910V), and the turn-off time of the switching devices Q5a and Q5b is delayed by 3 µs after time $t_4$. As can be seen from the figure, the conductive state of the switching devices Q5a and Q5b is extended by 3 µs, and thus the electric potential difference Eab between the nodes a and b will be reduced by 40% (e.g., changing from −11.5V in FIG. 3E to −7V in FIG. 4C), and jump of the driving voltages of the switching devices Q1a and Q1b may be reduced by 50%.

Figure 4D:
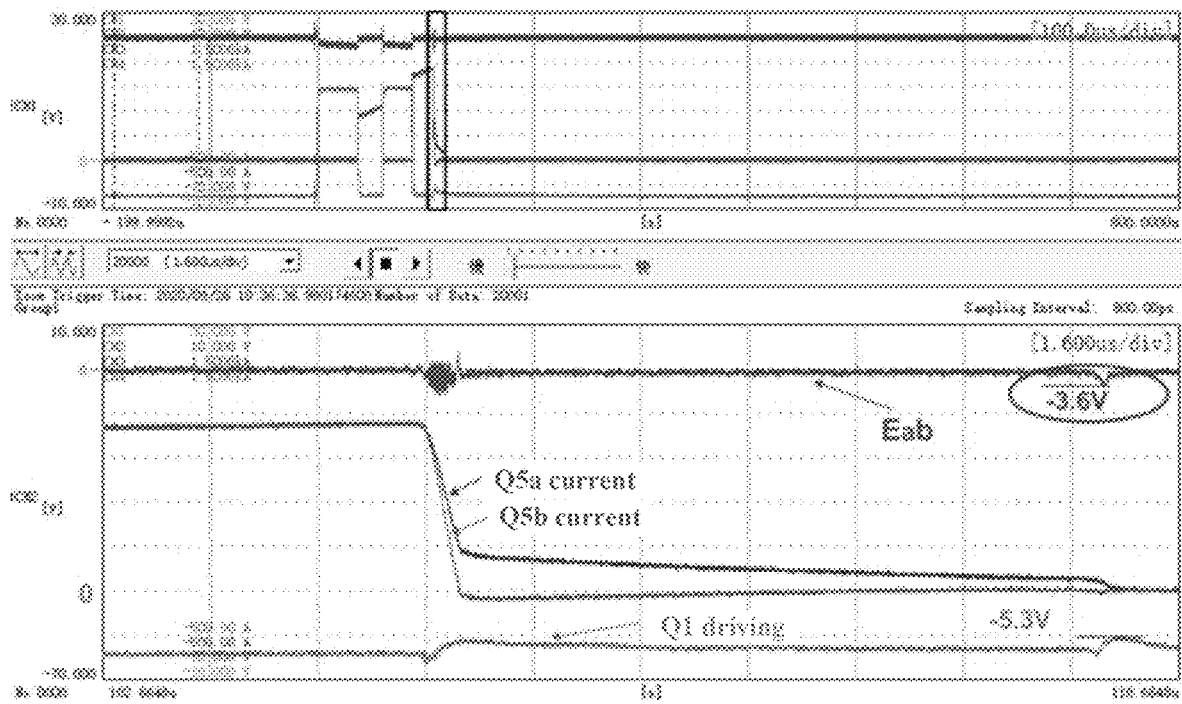
FIG. 4D is an experimental waveform graph of the parallel three-level active neutral point clamped (ANPC) circuit topology according to an exemplary embodiment of the invention under dual pulse experimental conditions, wherein the switching group Q5 is turned off after 10 μs delay after the time $t_4$.

As shown in FIG. 4D, it shows experimental waveforms under dual pulse experimental conditions (for example, a bus voltage is 1480V, and a sing-tube current of the switching devices Q5a and Q5b is 910V), and the turn-off time of the switching devices Q5a and Q5b is delayed by 10 µs after time $t_4$. As can be seen from the figure, the conductive state of the switching devices Q5a and Q5b is extended by 10 µs, and thus the electric potential difference Eab between the nodes a and b will be reduced by 70% (e.g., changing from −11.5V in FIG. 3E to −3.6V in FIG. 4D), and jump of the driving voltages of the switching devices Q1a and Q1b may be reduced by 82%.

Embodiment Two

In this embodiment, the converter of the present disclosure may be a neutral point clamped converter, and for example, may include a first switching set, a second switching set, a third switching set, a fourth switching set, a fifth switching set and a sixth switching set, and each of the first to sixth switching sets may include n switching devices (e.g., IGBT modules), where n may be greater than or equal to 2. Moreover, the first switching set, the third switching set, the fourth switching set and the fifth switching set are sequentially connected in series, and a first end of the second switching set is electrically connected to a junction node of the first switching set and the third switching set, and a second end of the second switching set is electrically connected to a first end of the sixth switching set, and a second end of the sixth switching set is electrically connected to a junction node of the fourth switching set and the fifth switching set.

Figure 5:
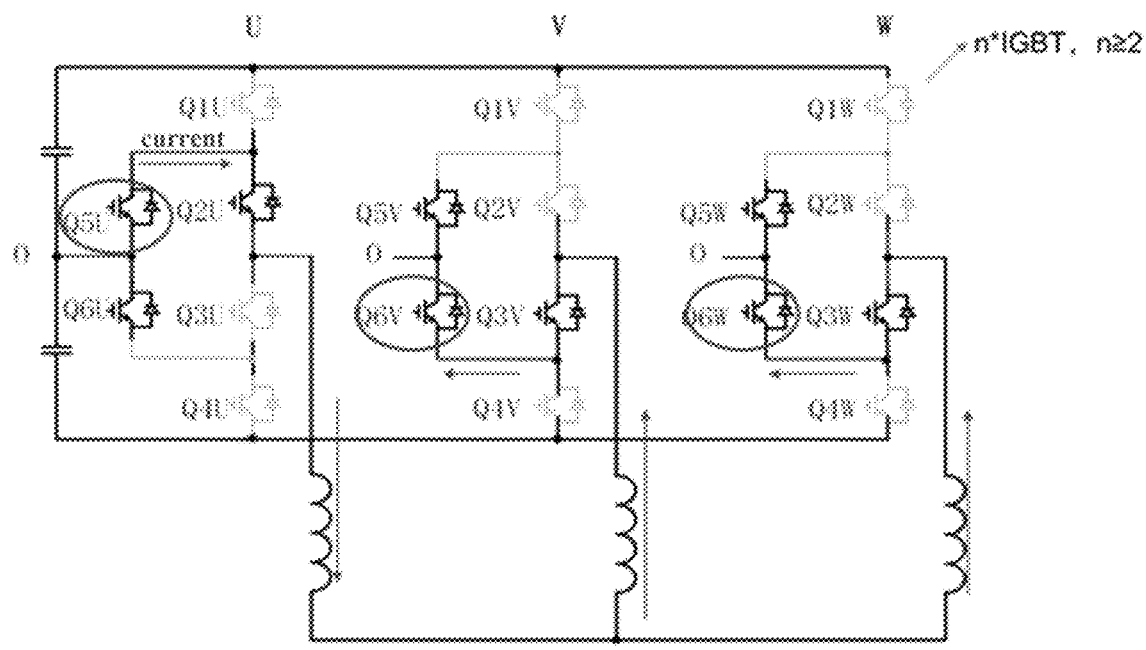
FIG. 5 is a schematic diagram of a ANPC circuit applied with an exemplary embodiment of the invention, for suppressing loop interference.

For example, as shown in FIG. 5, it shows a converter of the exemplary embodiment of the invention as an ANPC circuit. The circuit in this embodiment is a three-phase circuit. The first phase circuit may include a first switching set Q1U, a second switching set Q5U, a third switching set Q2U, a fourth switching set Q3U, a fifth switching set Q4U, and a sixth switching set Q6U. Similarly, the second phase circuit may include a first switching set Q1V, a second switching set Q5V, a third switching set Q2V, a fourth switching set Q3V, a fifth switching set Q4V, and a sixth switching set Q6V. The third phase circuit may include a first switching set Q1W, a second switching set Q5W, a third switching set Q2W, a fourth switching set Q3W, a fifth switching set Q4W, and a sixth switching set Q6W. Connection relationship of the switching sets in each phase circuit is similar with that in FIG. 3B, so the details are not described here. In other embodiments, the number of the corresponding switching devices of the respective switching set in the figure can be two or more.

In this embodiment, at a commutation time, a bidirectional path can be provided for currents in the three-phase circuit by delaying the turn-off time of the second switching set Q5U and the sixth switching set Q6V, Q6W, as shown in FIG. 5, thereby suppressing interference of a loop.

Embodiment Three

As shown in FIGS. 6A-6D, the circuit structure of the present disclosure may be applied to neutral point clamped (NPC) circuit using the clamp diode. For simplicity, in the circuit topology of this embodiment, the circuit structure in FIGS. 6A and 6B only shows a one-phase circuit. In addition, the number n of the corresponding switching devices of the respective switching set in the figures may be greater than or equal to 2.

Figure 6A:
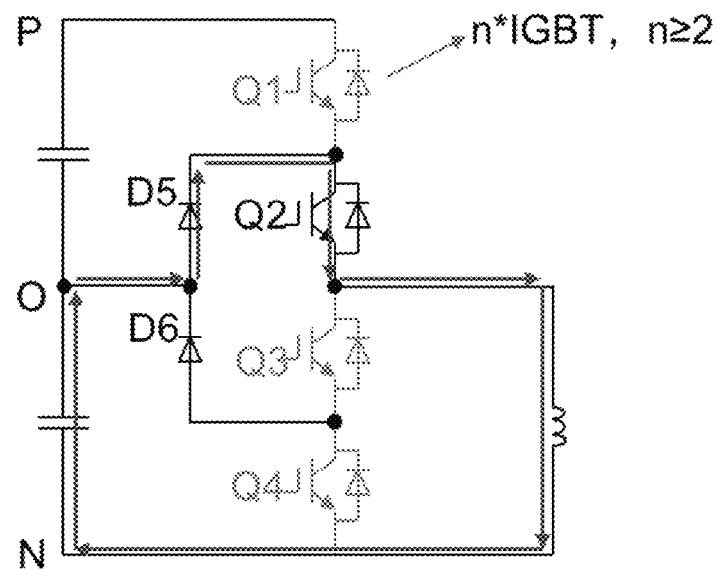
FIG. 6A is a schematic diagram of a working state of a circuit of a NPC circuit using the clamp diode applied with an exemplary embodiment of the invention, wherein a clamp diode group D5 is in a freewheeling state.
Figure 6B:
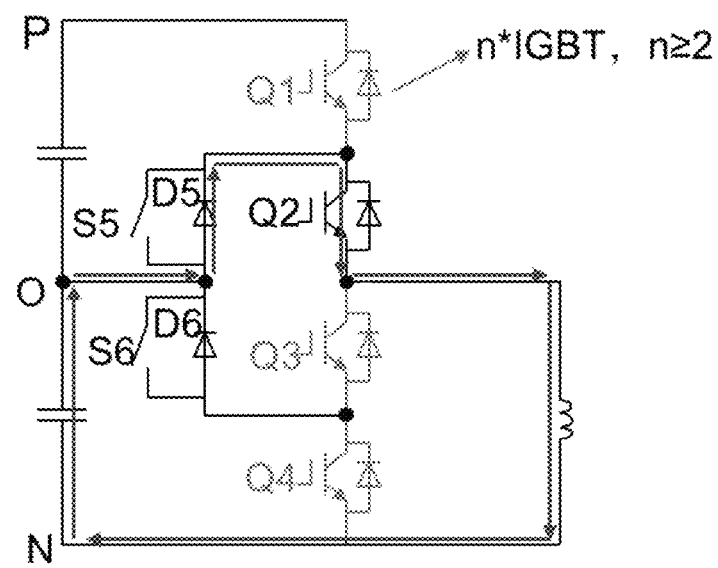
FIG. 6B is a schematic diagram of a working state of a NPC circuit according to an exemplary embodiment of the invention, wherein semiconductor switches are connected in parallel on clamped diodes of the NPC circuit, and wherein the clamped diode group D5 is in a freewheeling state.
Figure 6C:
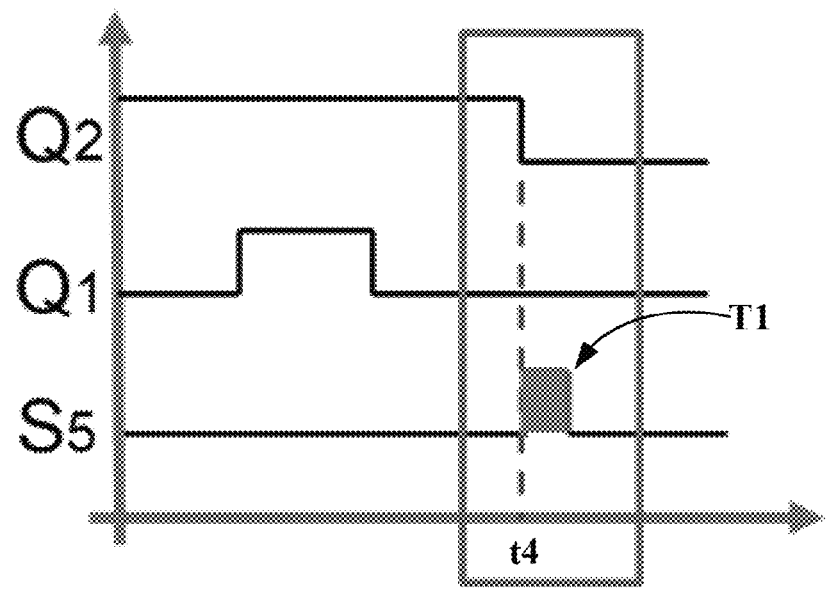
FIG. 6C is a schematic graph of switching logic of a NPC circuit applied with an exemplary embodiment of the invention, wherein a semiconductor switching group S5 is turned on at a time when the switching group Q2 is turned off.
Figure 6D:
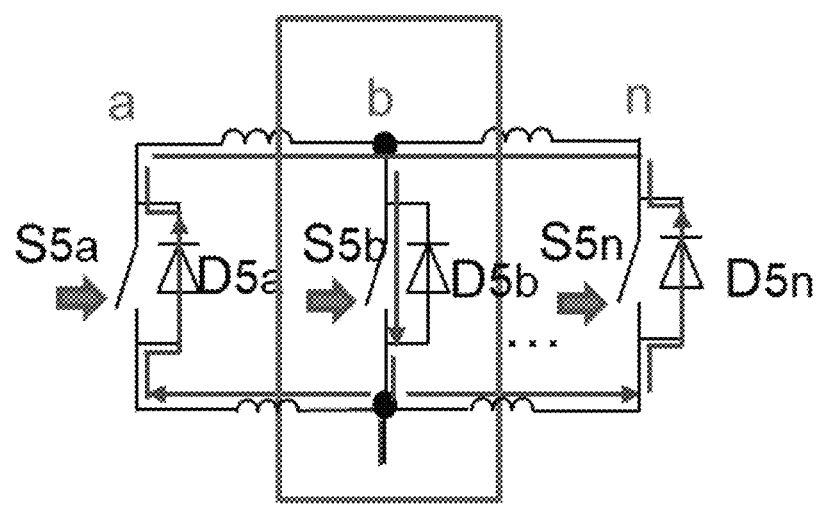
FIG. 6D is a schematic diagram of an equivalent circuit of a NPC circuit applied with an exemplary embodiment of the invention, wherein semiconductor switches S5a, S5b, . . . , and S5n are turned on at a time when the switching group Q2 is turned off, for providing a bidirectional path for currents.

FIG. 6A shows that the switching set is a clamped diode set D5, and the clamped diode set is in a working state of a circuit that is in a freewheeling state. The clamped diode set D5 of the NPC circuit shown in FIG. 6A is electrically connected to a semiconductor switching set S5 in parallel (i.e., a semiconductor switch is electrically connected in parallel to each of clamped diodes in the clamped diode set D5), and a clamped diode set D6 is electrically connected in parallel to a semiconductor switching set S6 (i.e., a parallel semiconductor switch is electrically connected in parallel to each of clamped diodes of the clamped diode set D6). As shown in FIG. 6B, it also shows a working state of a circuit where the clamped diode set D5 is in a freewheeling state. At a time when the switching set Q2 is turned off, the semiconductor switching set S5 may be turned on, for example, for a first time T1, as shown in FIG. 6C. As shown in FIG. 6D, the semiconductor switching set S5, such as, the semiconductor switches S5a, S5b, ..., and S5n, is turned on, thereby providing a bidirectional path for the currents, and suppressing voltage jump of the nodes a, b, ..., and n, and interference to the driving signal to the switching set Q1. In some embodiments, the semiconductor switches can be electronic switches.

Embodiment Four

Figure 7A:
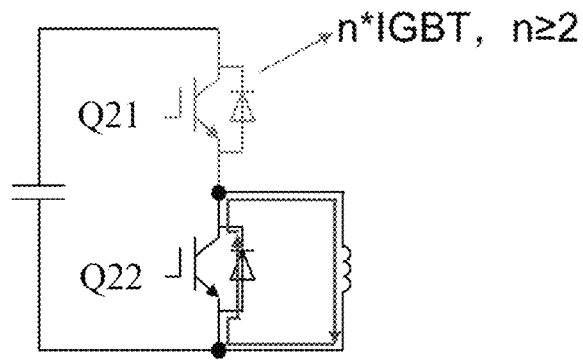
FIG. 7A is a schematic diagram of a parallel half-bridge circuit applied with an exemplary embodiment of the invention.

In this embodiment, the converter, for example, may be a two-level converter, and the two-level converter may include a first switching set and a second switching set connected in series to form a bridge arm of the two-level converter. Moreover, the first switching set may include n first switching devices, and the second switching set may include n second switching devices, where n>2. As shown in FIG. 7A, for simplicity, the circuit topology in this embodiment only shows a one-phase circuit, and the phase circuit includes a first switching set Q21 and a second switching set Q22 connected in series to form a bridge arm of the phase circuit. Optionally, the number n of the corresponding switching devices of the respective switching sets in the figure may be greater than or equal to 2, such as n=3.

Figure 7B:
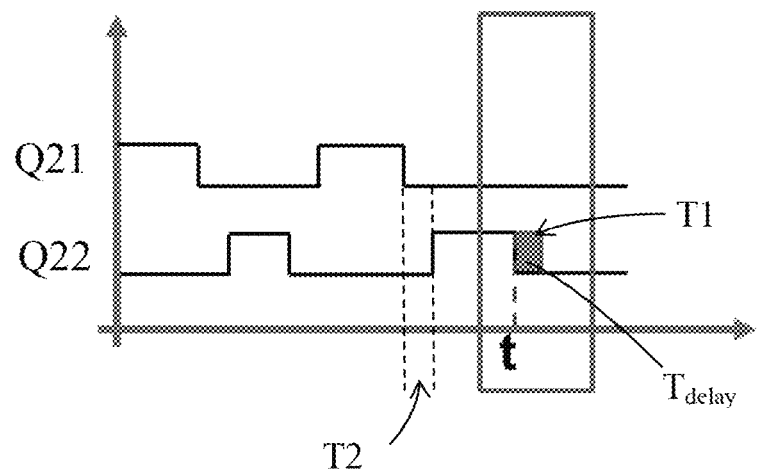
FIG. 7B is a schematic graph of switching logic of a parallel half-bridge circuit applied with an exemplary embodiment of the invention, wherein a switching group Q22 is turn off after a first time T1 delay.
Figure 7C:
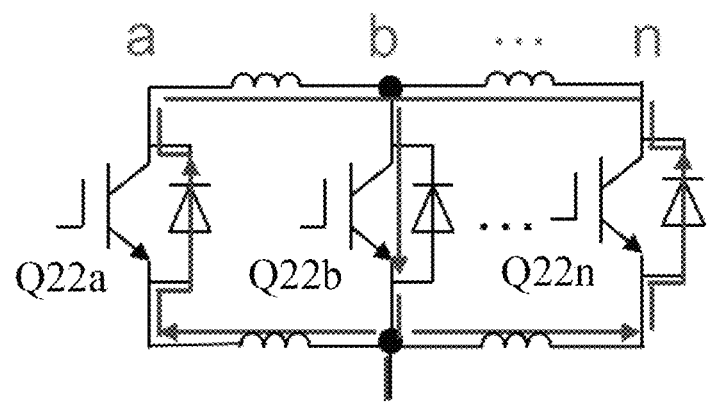
FIG. 7C is a schematic diagram of an equivalent circuit of a parallel half-bridge circuit applied by an exemplary embodiment of the invention, wherein semiconductor switches Q22a, Q22b, . . . , and Q22n in the are turned off with a delay for providing a bidirectional path for currents.

As shown in FIG. 7B, as for the two-level topology, a bidirectional path can be provided for a current by delaying the turn-off time of the switching set Q22 by a preset time $T_{delay}$. As shown in FIG. 7C, for example, interference to the driving signal of the upper switch (i.e., the switching device Q21) caused by voltage jump of the nodes a, b, ..., and n can be suppressed by delaying the turn-off time of the switching set Q22, including switching devices Q22a, Q22b, ..., and Q22n.

As shown in FIG. 7B, these second switching devices can be configured to be turned on after a second time T2 delaying from the turn-off time of the first switching devices, wherein the second time T2 is prior to the first time T1, and the first time T1 is a continuation of the second time.

As shown in FIG. 8, the present disclosure further provides a method 800 for suppressing loop interference of a converter. The method may be realized by step S801 and step S802.

In step S801, providing a converter, which includes a first switching set and a second switching set connected to each other. The first switching set includes a plurality of first switching devices, and first ends of the plurality of first switching devices are electrically connected to each other, and second ends of the plurality of first switching devices are electrically connected to each other. Likewise, the second switching set includes a plurality of second switching devices, and first ends of the plurality of second switching devices are electrically connected to each other, and second ends of the plurality of second switching devices are electrically connected to each other.

In step S802, configuring the plurality of second switching devices to be turned on within a first time after the turn-off time of the plurality of first switching devices, such that each of the plurality of second switching devices provides a path for current within the first time to reduce an electrical potential difference between the first end of the at least one of the plurality of second switching devices and the first end of the remaining of the plurality of second switching devices.

Based on the above, the present disclosure provides a device and method for reducing loop interference of devices connected in parallel, which, by turning on a plurality of second switching devices within a first time after the turn-off time of a plurality of first switching devices, enables each of the plurality of second switching devices to provide a path for current within the first time to reduce an electrical potential difference between the first end of the at least one of the plurality of second switching devices and the first end of the remaining of the plurality of second switching devices, for example, keeping the potentials substantially consistent, thereby avoiding occurrence of interference. The present disclosure can suppress interference to a voltage sampling circuit of other device, avoid influence on an insulation level of other device, suppress interference of a driving signal to other parallel devices using a central drive (i.e., the parallel devices are only configured with one set of drive modules) manner, and solve the problem of EMI of the system.

The present disclosure can be widely applied to a circuit such as two-level and n-level topologies (where devices are connected in parallel, n is greater than or equal to three), and improves reliability in parallel connection of the devices in a central drive manner. The circuit in the present disclosure is easy to be carried out without additional cost, and assists in improving electromagnetic compatibility of the system.

From the above embodiments, complexity of bus structure, and the requirement for consistency of parameters of the device can be reduced, thereby lowering cost.

Exemplary embodiments of the invention have been shown and described in details. It shall be understood that the invention is not limited to the disclosed embodiments. Instead, the invention intends to cover various modifications and equivalent settings included in the spirit and scope of the appended claims.

What is claimed is:

1. A converter, comprising:
a first switching set, comprising a plurality of first switching devices, wherein first ends of the plurality of first switching devices are electrically connected to each other, and second ends of the plurality of first switching devices are electrically connected to each other; and
a second switching set electrically connected to the first switching set, wherein the second switching set comprises a plurality of second switching devices, and first ends of the plurality of second switching devices are electrically connected to each other, and second ends of the plurality of second switching devices are electrically connected to each other, wherein parasitic inductances are between the first ends of the plurality of second switching devices;
wherein the plurality of second switching devices are turned on for a first time after a turn-off time of the plurality of first switching devices, such that each of the plurality of second switching devices provides a current loop within the first time to reduce an electrical potential difference between the first end of at least one of the plurality of second switching devices and the first end of the remaining of the plurality of second switching devices,
wherein the plurality of first switching devices are switched from off-state to on-state simultaneously at substantially the same point in time and switched from on-state to off-state simultaneously at substantially the same point in time, and the plurality of second switching devices are switched from off-state to on-state simultaneously at substantially the same point in time and switched from on-state to off-state simultaneously at substantially the same point in time,
wherein the converter is a neutral point clamped (NPC) converter, and the neutral point clamped converter comprises the first switching set, the second switching set, a third switching set, a fourth switching set, a fifth switching set and a sixth switching set,
wherein the first switching set, the third switching set, the fourth switching set and the fifth switching set are sequentially connected in series, and a first end of the second switching set is electrically connected to a junction node of the first switching set and the third switching set, and a second end of the second switching set is electrically connected to a first end of the sixth switching set, and a second end of the sixth switching set is electrically connected to a junction node of the fourth switching set and the fifth switching set, and
wherein the first time is a period of time starting from a turn-off time of the third switching set.

2. The converter according to claim 1, wherein the electrical potential difference is zero.

3. The converter according to claim 1, wherein each of the plurality of second switching devices comprises a first switch and a second switch electrically connected in parallel.

4. The converter according to claim 3, wherein one of the first switch and the second switch is an electronic switch, and the other of the first switch and the second switch is a semiconductor switch.

5. The converter according to claim 3, wherein one of the first switch and the second switch is a semiconductor switch, and the other of the first switch and the second switch is a diode, wherein a first end of the semiconductor switch is electrically connected to a cathode of the diode, and a second end of the semiconductor switch is electrically connected to an anode of the diode.

6. The converter according to claim 1, wherein a direction of a current flowing through the at least one of the plurality of second switching devices is opposite to a direction of a current flowing through the remaining of the plurality of second switching devices.

7. The converter according to claim 1, wherein a current value of a current flowing through the at least one of the plurality of second switching devices is different from a current value of a current flowing through the remaining of the plurality of second switching devices.

8. The converter according to claim 1, further comprising a central drive module coupled to the plurality of first switching devices, respectively, wherein the central drive module is configured to drive the plurality of first switching devices.

9. A method for suppressing loop interference of a converter, comprising:
controlling the converter, wherein the converter comprises a first switching set and a second switching set electrically connected to each other, and the first switching set comprises a plurality of first switching devices, and first ends of the plurality of first switching devices are electrically connected to each other, and second ends of the plurality of first switching devices are electrically connected to each other, and the second switching set comprises a plurality of second switching devices, and first ends of the plurality of second switching devices are electrically connected to each other, and second ends of the plurality of second switching devices are electrically connected to each other, wherein parasitic inductances are between the first ends of the plurality of second switching devices;
configuring the plurality of second switching devices to turn on for a first time after a turn-off time of the plurality of first switching devices, such that each of the plurality of second switching devices provides a current loop within the first time to reduce an electrical potential difference between the first end of the at least one of the plurality of second switching devices and the first end of the remaining of the plurality of second switching devices, wherein the plurality of first switching devices are switched from off-state to on-state simultaneously at substantially the same point in time and switched from on-state to off-state simultaneously at substantially the same point in time, and the plurality of second switching devices are switched from off-state to on-state simultaneously at substantially the same point in time and switched from on-state to off-state simultaneously at substantially the same point in time,
wherein the converter is a neutral point clamped (NPC) converter, and the neutral point clamped converter comprises the first switching set, the second switching set, a third switching set, a fourth switching set, a fifth switching set and a sixth switching set,
wherein the first switching set, the third switching set, the fourth switching set and the fifth switching set are sequentially connected in series, and a first end of the second switching set is electrically connected to a junction node of the first switching set and the third switching set, and a second end of the second switching set is electrically connected to a first end of the sixth switching set, and a second end of the sixth switching set is electrically connected to a junction node of the fourth switching set and the fifth switching set, and wherein the first time is a period of time starting from a turn-off time of the third switching set.

10. The method according to claim 9, wherein the electrical potential difference is zero.

11. The method according to claim 9, wherein each of the plurality of second switching devices comprises a first switch and a second switch electrically connected in parallel.

12. The method according to claim 11, wherein one of the first switch and the second switch is an electronic switch, and the other of the first switch and the second switch is a semiconductor switch.

13. The method according to claim 11, wherein one of the first switch and the second switch is a semiconductor switch, and the other of the first switch and the second switch is a diode, wherein a first end of the semiconductor switch is electrically connected to a cathode of the diode, and a second end of the semiconductor switch is electrically connected to an anode of the diode.

14. The method according to claim 9, wherein a direction of a current flowing through the at least one of the plurality of second switching devices is opposite to a direction of a current flowing through the remaining of the plurality of second switching devices.

15. The method according to claim 9, wherein a current value of a current flowing through the at least one of the plurality of second switching devices is different from a current value of a current flowing through the remaining of the plurality of second switching devices.

16. The method according to claim 9, wherein the converter further comprises a central drive module coupled to the plurality of first switching devices, respectively, and the central drive module is configured to drive the plurality of first switching devices.

* * * * *